(12) United States Patent
Liu

(10) Patent No.: US 8,983,107 B2
(45) Date of Patent: Mar. 17, 2015

(54) SILICON BASED CAPACITIVE MICROPHONE

(71) Applicant: Guojun Liu, Shenzhen (CN)

(72) Inventor: Guojun Liu, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 45 days.

(21) Appl. No.: 13/771,138

(22) Filed: Feb. 20, 2013

(65) Prior Publication Data

US 2013/0216068 A1 Aug. 22, 2013

(30) Foreign Application Priority Data

Feb. 21, 2012 (CN) ............... 2012 2 0056074 U

(51) Int. Cl.
| | |
|---|---|
| H04R 9/08 | (2006.01) |
| H04R 11/04 | (2006.01) |
| H04R 25/00 | (2006.01) |
| G01L 9/00 | (2006.01) |
| H04R 19/00 | (2006.01) |
| H04R 1/02 | (2006.01) |
| H04R 1/04 | (2006.01) |
| B81B 7/00 | (2006.01) |
| H04R 19/04 | (2006.01) |
| H04R 1/08 | (2006.01) |
| B81B 3/00 | (2006.01) |

(52) U.S. Cl.
CPC ............. *H04R 19/005* (2013.01); *H04R 1/083* (2013.01); *H04R 1/02* (2013.01); *H04R 1/04* (2013.01); *B81B 3/0027* (2013.01); *B81B 7/0032* (2013.01); *B81B 2201/0257* (2013.01); *H04R 19/04* (2013.01)
USPC ............ 381/361; 381/355; 381/174; 257/419

(58) Field of Classification Search
CPC ........ H04R 19/005; H04R 19/04; H04R 1/02; H04R 1/04; B81B 3/0027; B81B 7/0009; B81B 7/0032; B81B 7/0061; B81B 7/0064; B81B 7/008; B81B 2201/0257; B81B 2207/094; B81B 2207/095; B81B 2207/096
USPC .......... 381/174, 175, 355, 361; 257/254, 416, 257/419
See application file for complete search history.

(56) References Cited

U.S. PATENT DOCUMENTS

| | | | | |
|---|---|---|---|---|
| 2011/0062573 | A1* | 3/2011 | Zhe et al. | 257/680 |
| 2011/0165717 | A1* | 7/2011 | Lee et al. | 438/50 |
| 2011/0198714 | A1* | 8/2011 | Yang | 257/416 |
| 2012/0027234 | A1* | 2/2012 | Goida | 381/150 |
| 2012/0043629 | A1* | 2/2012 | Minervini | 257/416 |
| 2012/0057729 | A1* | 3/2012 | Rauscher | 381/174 |

* cited by examiner

*Primary Examiner* — Jesse Elbin
(74) *Attorney, Agent, or Firm* — Anova Law Group, PLLC

(57) ABSTRACT

A silicon based capacitive microphone includes a printed circuit board, a shell mounted on the printed circuit board and forming a receiving space together with the printed board, a chamber support located on top of the printed circuit board and received in the receiving space, a transducer unit and a controlling chip respectively mounted on the chamber support, wherein the chamber support forms a first chamber together with the printed board, the chamber support includes an opening, the transducer unit is provided with a second chamber and covers the opening, the second chamber communicates with the first chamber via the opening.

9 Claims, 3 Drawing Sheets

US 8,983,107 B2

SILICON BASED CAPACITIVE MICROPHONE

FIELD OF THE INVENTION

The present invention generally relates to the art of microphones and, more particularly, to a silicon based capacitive microphone.

DESCRIPTION OF RELATED ART

Silicon based capacitive transducer units, such as MEMS (Micro-Electro-Mechanical-Systems) microphones, are well known in the art. Silicon condenser microphones are widely used in mobile phones to receive and convert sound waves into electrical signals.

Typically, such a capacitive microphone generally includes a MEMS die having a silicon substrate, a backplate arranged on the substrate, and a moveable diaphragm separated from the backplate for forming a capacitor with the backplate. While external sound waves reach the diaphragm, the diaphragm will be activated to vibrate relative to the backplate, which changes the distance between the diaphragm and the backplate and changes the capacitance value. As a result, the sound waves are converted into electrical signals.

A related condenser microphone includes a printed circuit board (PCB), a microphone die mounted on the PCB, and a cover covering the microphone die. The PCB includes a back volume which is covered by the microphone die for providing a pressure reference for the microphone die. However, the volume of the back volume is too limited to satisfy the demand of frequency response.

So, it is necessary to provide a new means for solving the problem mentioned above.

DETAILED DESCRIPTION OF THE EXAMPLARY EMBODIMENT

Reference will now be made to describe the exemplary embodiments of the present invention in detail.

Figure 1:
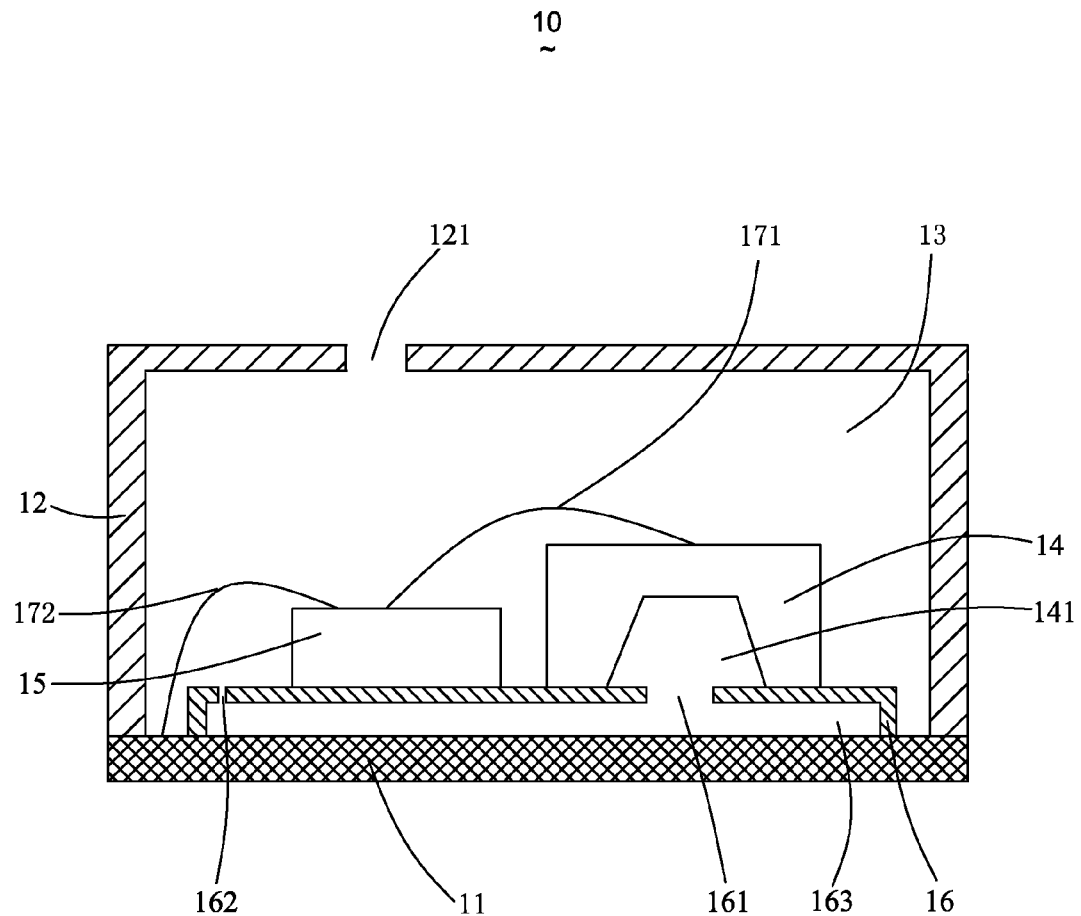
FIG. 1 is a cross-sectional view of a silicon based capacitive microphone in accordance with a first embodiment of the present disclosure.

Referring to FIG. 1, a silicon based capacitive microphone 10 in accordance with a first embodiment of the present invention is disclosed. The microphone 10 includes a printed circuit board (PCB) 11, a shell 12 mounted on the PCB 11 and forming a receiving space 13 together with the PCB 11, a chamber support 16 located on top of the PCB 11 and received in the receiving space 13, a MEMS (Micro-Electro-Mechanical-Systems) transducer unit 14 and a controlling chip 15 respectively mounted on the chamber support 16, a first wire 171 for electrically connecting the MEMS transducer unit 14 to the controlling chip 15, and a second wire 172 for electrically connecting the controlling chip 15 to the PCB 11, the chamber support 16 forming a first chamber 163 together with the PCB 11.

The shell 12 includes a sound aperture 121 for receiving external sound waves into the receiving space 13.

The chamber support 16 includes an opening 161. The MEMS transducer unit 14 is provided with a second chamber 141 and covers the opening 161. The second chamber 141 communicates with the first chamber 163. Accordingly, the first chamber 163 and the second chamber 141 cooperatively form a back chamber of the microphone 10, thereby enlarging the volume of the back chamber of the microphone 10. Meanwhile the sensitivity, the frequency response, and the Signal-Noise-Rate are improved obviously.

In addition, the chamber support 16 includes a plurality of leakage holes 162 communicating the first chamber 163 with the receiving space. Optionally, the leakage holes may be formed in the PCB for communicating the first chamber with the outside. When the microphone 10 works, expanded air can be leaked to the outside through the leakage holes so as to protect the microphone 10. The amount and shape of the leakage hole 162 may be adjusted or changed according to the requirements of design, manufacturing, or individual user. The air in the second chamber 141 could be expanded by the heat produced by the capacitor, or by the high-frequency vibration of the the diaphragm.

Figure 2:
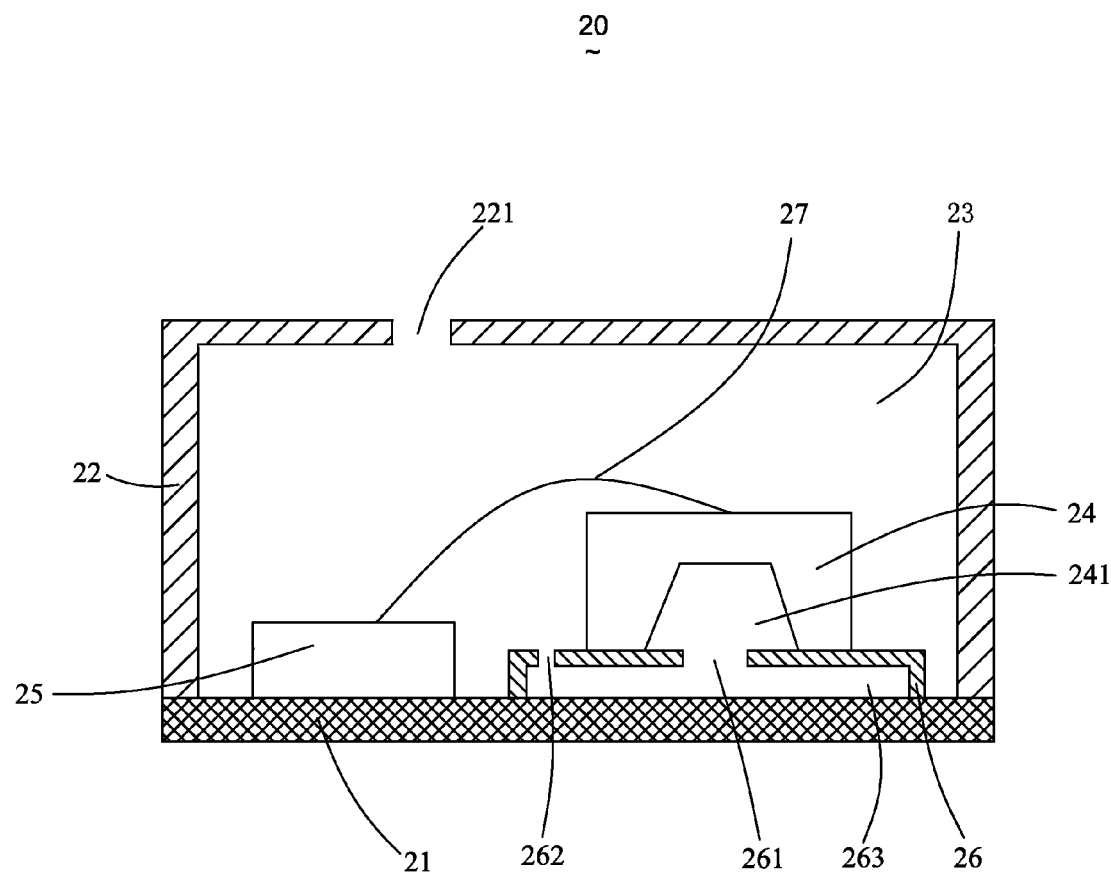
FIG. 2 is a cross-sectional view of a silicon based capacitive microphone in accordance with a second embodiment of the present disclosure.

Referring to FIG. 2, a silicon based capacitive microphone 20 in accordance with a second embodiment of the present invention is disclosed. The microphone 20 includes a printed circuit board (PCB) 21, a shell 22 mounted on the PCB 21 and forming a receiving space 23 together with the PCB 21, a chamber support 26 located on top of the PCB 21 and received in the receiving space 23, a controlling chip 25 electrically mounted on the PCB 21, a MEMS (Micro-Electro-Mechanical-Systems) transducer unit 24 mounted on the chamber support 26, and a wire 27 for electrically connecting the MEMS transducer unit 24 to the controlling chip 25. The chamber support 26 forming a first chamber 263 together with the PCB 21.

The shell 22 includes a sound aperture 221 for receiving external sound waves into the receiving space 23.

The chamber support 26 includes an opening 261, the MEMS transducer unit 24 is provided with a second chamber 241 and covers the opening 261. The second chamber 241 communicates with the first chamber 263, by which the first chamber 263 and the second chamber 241 form a back chamber of the microphone, and therefore, the volume of the back chamber of the microphone 20 is enlarged. Meanwhile the sensitivity, the frequency response, and the Signal-Noise-Rate are improved obviously.

In addition, the chamber support 26 includes a plurality of leakage holes 262 communicating the first chamber 263 with the receiving space 23. Optionally, the leakage holes may be formed in the PCB for communicating the first chamber with the outside. When the microphone 20 works, expanded air can be leaked to the outside through the leakage holes so as to protect the microphone 20. The amount and shape of the leakage hole 262 may be adjusted or changed according to the requirements of design, manufacturing, or individual user. The air in the second chamber 241 could be expanded by the heat produced by the capacitor, or by the high-frequency vibration of the the diaphragm.

Figure 3:
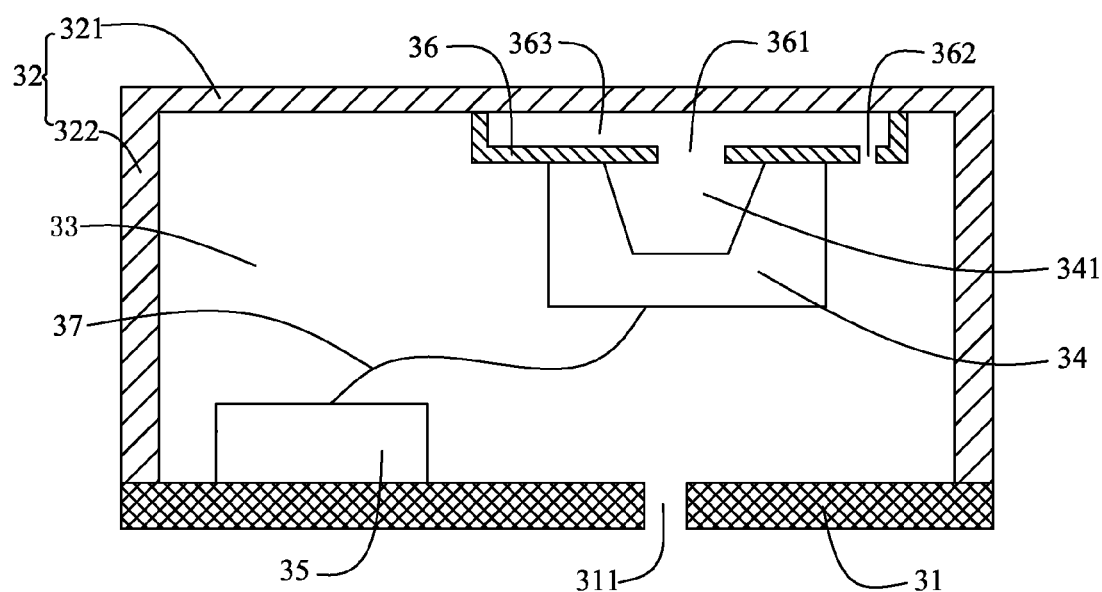
FIG. 3 is a cross-sectional view of a silicon based capacitive microphone in accordance with a third embodiment of the present disclosure.

Referring to FIG. 3, a silicon based capacitive microphone 30 in accordance with a third embodiment of the present invention is disclosed. The microphone 30 includes a printed circuit board (PCB) 31, a shell 32 mounted on the PCB 31 and forming a receiving space 33 together with the PCB 31, and a controlling chip 35 electrically mounted on the PCB 31. The shell 32 includes a sidewall 322 attached to the PCB 31 and an upper wall 321 supported by the sidewall 322. The microphone 30 further includes a chamber support 36 mounted on the upper wall 321 and forming a first chamber 363 together with the upper wall 321, a MEMS (Micro-Electro-Mechanical-Systems) transducer unit 34 mounted on the chamber support 36 and received in the receiving space 33, and a wire 37 for electrically connecting the MEMS transducer unit 34 to the controlling chip 35. the chamber support 36 received in the receiving space 33.

The printed circuit board (PCB) 31 includes a sound aperture 311 for receiving external sound waves into the receiving space 33.

The chamber support 36 includes an opening 361, the MEMS transducer unit 36 is provided with a second chamber 341 and covers the opening 361. The second chamber 341 communicates with the first chamber 363. Accordingly, the first chamber 363 and the second chamber 341 cooperatively form a back chamber of the microphone 30, thereby enlarging the volume of the back chamber of the microphone 30. Meanwhile, the sensitivity, the frequency response, and the Signal-Noise-Rate are improved obviously.

In addition, the chamber support 36 includes a plurality of leakage holes 362 communicating the first chamber 363 with the receiving space. Optionally, the leakage holes may be formed in the PCB for communicating the first chamber with the outside. When the microphone 30 works, expanded air can be leaked to the outside through the leakage holes so as to protect the microphone 30. The amount and shape of the leakage hole 362 may be adjusted or changed according to the requirements of design, manufacturing, or individual user. The air in the second chamber 341 could be expanded by the heat produced by the capacitor, or by the high-frequency vibration of the the diaphragm.

While the present invention has been described with reference to specific embodiments, the description of the invention is illustrative and is not to be construed as limiting the invention. Various of modifications to the present invention can be made to the exemplary embodiments by those skilled in the art without departing from the true spirit and scope of the invention as defined by the appended claims.

What is claimed is:

1. A silicon based capacitive microphone, comprising:
a printed circuit board;
a shell mounted on the printed circuit board and forming a receiving space together with the printed circuit board;
a chamber support located on top of the printed circuit board and received in the receiving space;
a transducer unit and a controlling chip respectively mounted on the chamber support; wherein
the chamber support forms a first chamber together with the printed board, the chamber support includes an opening, the transducer unit is provided with a second chamber and covers the opening, and the second chamber communicates with the first chamber via the opening, a plurality of leakage holes communicating with the first chamber is formed on the chamber support.

2. The silicon based capacitive microphone as described in claim 1, wherein the shell includes a sound aperture for receiving external sound waves into the receiving space.

3. The silicon based capacitive microphone as described in claim 1, wherein the silicon based capacitive microphone further comprises a first wire for electrically connecting the transducer unit to the controlling chip and a second wire for electrically connecting the controlling chip to the printed circuit board.

4. A silicon based capacitive microphone, comprising:
a printed circuit board;
a shell mounted on the printed circuit board and forming a receiving space together with the printed circuit board;
a chamber support located on top of the printed circuit board and received in the receiving space;
a transducer unit mounted on the chamber support;
a controlling chip directly mounted on the printed circuited board; wherein
the chamber support forms a first chamber together with the printed board; the chamber support includes an opening covered by the transducer unit, the transducer unit is provided with a second chamber and the second chamber communicates with the first chamber via the opening, a plurality of leakage holes communicating with the first chamber is formed on the chamber support.

5. The silicon based capacitive microphone as described in claim 4, wherein the shell includes a sound aperture for receiving external sound waves into the receiving space.

6. The silicon based capacitive microphone as described in claim 4, wherein the silicon based capacitive microphone further comprises a wire for electrically connecting the transducer unit to the controlling chip.

7. A silicon based capacitive microphone, comprising:
a printed circuit board;
a shell including a sidewall attached to the printed circuit board and an upper wall supported by the sidewall;
a controlling chip directly mounted on the printed circuit board;
a chamber support includes an opening and mounted on the upper wall;
a transducer unit including a second chamber and mounted on the chamber support; wherein
the shell forms a receiving space together with the printed circuit board, the chamber support is received in the receiving space and forms a first chamber together with the upper wall, the second chamber communicates with the first chamber via the opening, a plurality of leakage holes communicating with the first chamber is formed on the chamber support.

8. The silicon based capacitive microphone as described in claim 7, wherein the printed circuited board includes a sound aperture for receiving external sound waves into the receiving space.

9. The silicon based capacitive microphone as described in claim 7, wherein the silicon based capacitive microphone further comprises a wire for electrically connecting the transducer unit to the controlling chip.

* * * * *